(12) United States Patent
Wu et al.

(10) Patent No.: US 9,606,451 B2
(45) Date of Patent: Mar. 28, 2017

(54) EXPOSURE APPARATUS, PHOTOLITHOGRAPHICAL RETICLES AND EXPOSURE METHODS THEREOF

(71) Applicant: Semiconductor Manufacturing International (Shanghai) Corporation, Shanghai (CN)

(72) Inventors: Qiang Wu, Shanghai (CN); Chang Liu, Shanghai (CN); Jing'An Hao, Shanghai (CN); Huayong Hu, Shanghai (CN); Yang Liu, Shanghai (CN)

(73) Assignee: SEMICONDUCTOR MANUFACTURING INTERNATIONAL CORPORATION, SHANGHAI (CN)

( * ) Notice: Subject to any disclaimer, the term of this patent is extended or adjusted under 35 U.S.C. 154(b) by 39 days.

(21) Appl. No.: 14/560,803

(22) Filed: Dec. 4, 2014

(65) Prior Publication Data
US 2015/0205215 A1 Jul. 23, 2015

(30) Foreign Application Priority Data
Jan. 20, 2014 (CN) .......................... 2014 1 0025069

(51) Int. Cl.
G03B 27/42 (2006.01)
G03F 7/20 (2006.01)

(52) U.S. Cl.
CPC ...... *G03F 7/70358* (2013.01); *G03F 7/70283* (2013.01); *G03F 7/70725* (2013.01)

(58) Field of Classification Search
CPC ............. G03F 7/70358; G03F 7/70725; G03F 7/70225

USPC .................................. 355/52, 53, 55, 67–71
See application file for complete search history.

(56) References Cited

U.S. PATENT DOCUMENTS

| 6,118,515 A * | 9/2000 | Wakamoto | G03F 7/70358 355/53 |
| 6,552,775 B1 * | 4/2003 | Yanagihara | G03F 7/70225 250/492.2 |
| 6,710,847 B1 * | 3/2004 | Irie | G03F 7/70475 235/462.05 |
| 2005/0103260 A1 * | 5/2005 | Lee | G03F 7/70358 117/103 |

FOREIGN PATENT DOCUMENTS

KR 20130129065 A * 11/2013 ......... G03F 7/70358

* cited by examiner

*Primary Examiner* — Hung Henry Nguyen
(74) *Attorney, Agent, or Firm* — Anova Law Group, PLLC

(57) ABSTRACT

An exposure apparatus is provided for performing a column scan-exposure process. The exposure apparatus includes a base for supporting the exposure apparatus; and a reticle stage configured for holding a reticle having at two mask pattern regions and carrying the reticle to move reciprocally along a scanning direction. The exposure apparatus also includes a wafer stage configured for holding a wafer and carrying the wafer to move reciprocally along the scanning direction. Further, the exposure apparatus includes a control unit configured to control the reticle stage and the wafer stage to cooperatively move to cause the at least two mask pattern regions of the reticle on the reticle stage to be continuously and sequentially projected on at least two corresponding exposure shots of the wafer on the wafer stage along the scanning direction to perform a column scan-exposure process.

16 Claims, 7 Drawing Sheets

EXPOSURE APPARATUS, PHOTOLITHOGRAPHICAL RETICLES AND EXPOSURE METHODS THEREOF

CROSS-REFERENCES TO RELATED APPLICATIONS

This application claims the priority of Chinese patent application No. 201410025069.X, filed on Jan. 20, 2014, the entirety of which is incorporated herein by reference.

FIELD OF THE INVENTION

The present invention generally relates to the field of semiconductor technology and, more particularly, relates to exposure apparatus, photolithographic reticles and exposure methods thereof.

BACKGROUND

Photolithography process is an important process of the semiconductor manufacturing technology, which transfers patterns on a reticle to a substrate by an exposure process. Photolithography process is one of the core steps for the manufacturing of large scale integrations (LSIs).

The development of the photolithography technology has gone through the contact photolithography technology, the proximity photolithography technology, the scanning-projection photolithography technology, the step-and-repeat photolithography technology and the state-of-the-art step-and-scan photolithography technology. The step-and-scan photolithography technology is an advanced technology of the photolithographic fabrication of the integrated circuits (ICs).

In a photolithography process, a silicon wafer (or other substrate) having a photoresist layer is divided by a plurality of exposure shots; the step-and-scan photolithography technology utilizes the synchronic motion of a reticle stage and a wafer stage to project the patterns on the reticle to a single exposure shot. During such a process, the wafer stage moves along the exposure scanning direction of an exposure apparatus. At the same time, the reticle stage moves along a direction opposite to the moving direction of the wafer stage. Thus, a scan-exposure step for the exposure shot is finished. After scanning and exposing the single exposure shot, the wafer stage steps to another exposure shot and perform another scan-exposure process. The step-and-scan process is repeated until all the exposure shots are scanned and exposed. Then, patterns with a certain-time reduced size are formed on the wafer after subsequent fixing and developing process.

FIG. 1 illustrates the exposure process of an existing exposure apparatus. As shown in FIG. 1, the wafer 100 has a plurality of exposure shots. After scanning the first exposure shot 101 in a first direction (the arrow direction), the adjacent second exposure shot 102 is scanned in a second direction opposite to the first direction. Such a process is repeated in a reciprocal way until all the exposure shots on the wafer 100 are exposed.

The scan-exposure process for each of the exposure shots includes three stages: acceleration stage, scanning and exposure stage and de-acceleration stage. The wafer stage and the reticle stage start from a stop status; and accelerate to a predetermined speed after a time range of $t_{ac}$. Then, the wafer stage and the reticle stage start to scan and expose with the constant predetermined speed. After another time range of $t_{sc}$, the wafer stage and the reticle stage start to de-accelerate. After another time range of $t_{de}$, the speed of the wafer stage and the reticle stage reaches to zero.

Therefore, in the entire exposure process for a single exposure shot, only the time rang of $t_{sc}$ is for the exposure, the time range of $t_{ac}$ and the time range of $t_{de}$ are for assisting the scanning. For example, it needs 0.26 s for scanning and exposing a single exposure shot using a speed of 600 mm/s. During this time range, the acceleration time $t_{ac}$ is 0.1 s, the scan and exposure time $t_{sc}$ is 0.06 s; and the de-acceleration time is 0.1 s. That is, the scan and exposure time $t_{sc}$ is only approximately 20% of the total time of the exposure process of a single exposure shot.

Because the scan-exposure process for each of the exposure shots all includes the acceleration time $t_{ac}$, the scan and exposure time $t_{sc}$ and the de-acceleration time $t_{de}$, the exposure time for an entire wafer may be relatively long and the exposure efficiency of the existing exposure apparatus is relatively low. The disclosed methods and systems are directed to solve one or more problems set forth above and other problems.

BRIEF SUMMARY OF THE DISCLOSURE

One aspect of the present disclosure includes an exposure apparatus for performing a column scan-exposure process. The exposure apparatus includes a base for supporting the exposure apparatus; and a reticle stage configured for holding a reticle having at least two mask pattern regions and carrying the reticle to move reciprocally along a scanning direction. The exposure apparatus also includes a wafer stage configured for holding a wafer and carrying the wafer to move reciprocally along the scanning direction. Further, the exposure apparatus includes a control unit configured to control the reticle stage and the wafer stage to cooperatively move to cause the at least two mask pattern regions of the reticle on the reticle stage to be continuously and sequentially projected on at least two corresponding exposure shots of the wafer on the wafer stage along the scanning direction to perform a column scan-exposure process.

Another aspect of the present disclosure includes a column scan-exposure method. The column scan-exposure method includes loading a wafer having a plurality of exposure shots on a wafer stage. The column scan-exposure method also includes loading a reticle having at least two mask pattern regions distributed along a scanning direction on a reticle stage. Further, the column scan-exposure method includes continuously and sequentially exposing at least two exposure shots by controlling the wafer stage and the reticle stage to cooperatively move to cause an exposure light passing through the at least two mask pattern regions to be projected onto at least two exposure shots of a column of the exposure shots Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
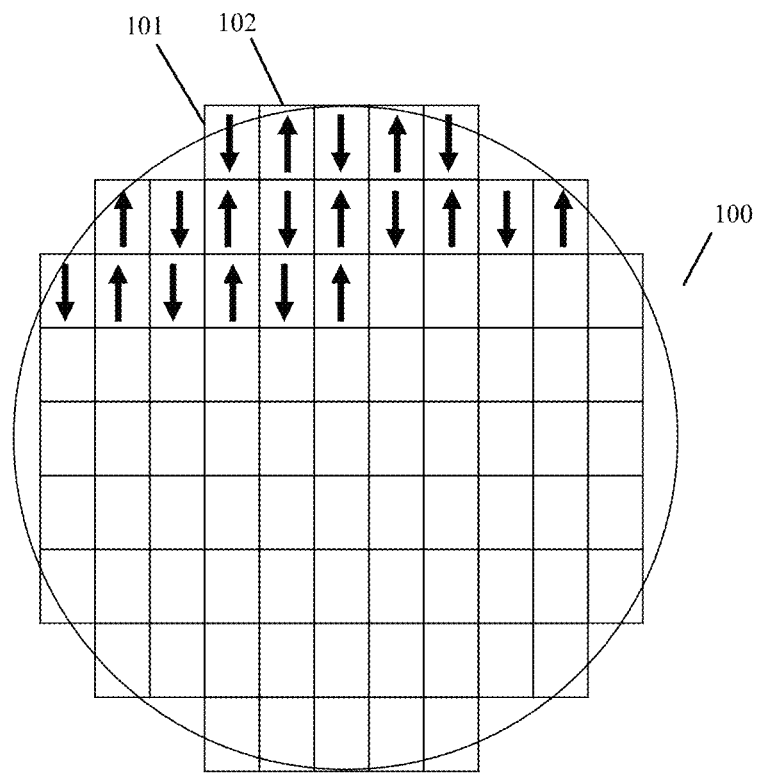
FIG. 1 illustrates the exposure process of an existing exposure apparatus.
Figure 2:
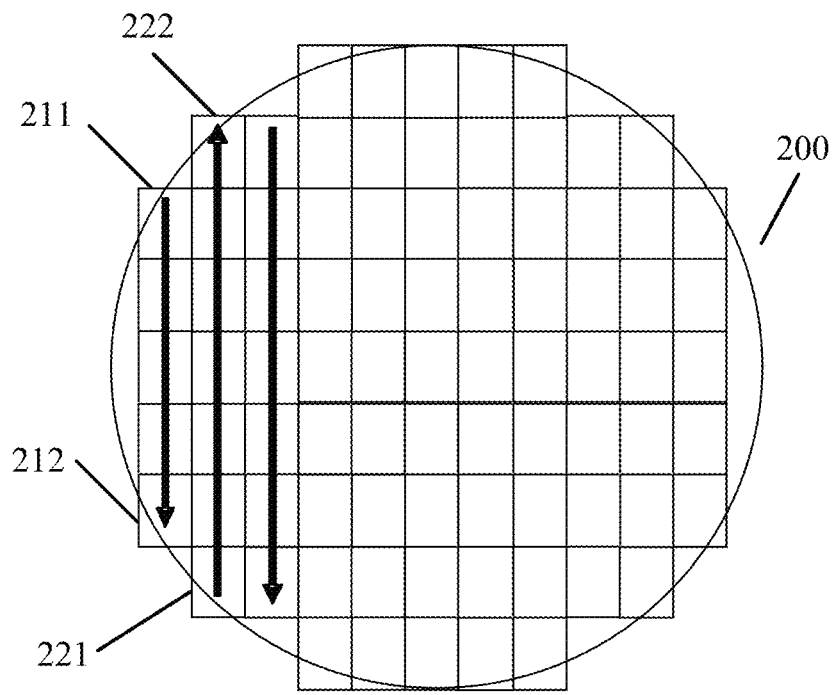
FIG. 2 illustrates a column scan-exposure process of the exposure shots performed by an exemplary exposure apparatus consistent with the disclosed embodiments.

FIG. 2 illustrates a column scan-exposure process of the exposure shots performed by an exemplary exposure apparatus consistent with the disclosed embodiments. As shown in FIG. 2, the exposure shots on a wafer 200 are usually arranged with regular rows and columns, thus a plurality of exposure shots on a same row or a same columns may sequentially scanned and exposed with no intervals. That is, after scanning and exposing one exposure shot of a row of exposure shots or a column exposures shots, the wafer and the reticle may continue moving oppositely with a constant speed to scan and expose next exposure shot in the same row or column until all the exposure shots in the same row or column are also exposed. Then, the wafer stage and the reticle stage may de-accelerate; and scan and expose the next row or column of exposure shots.

Referring to FIG. 2, the wafer 200 may have a plurality of exposure shots arranged with rows and columns, after scanning and exposing the first exposure shot 211 of the first column of exposure shots with a first direction, the rest of the exposure shots may be continually scanned and exposed with the predetermined constant speed until the scanning and exposing of the last exposure shot 212 of the first column is finished. Then, the first exposure shot 221 of the second column may be scanned and exposed along a second direction opposite to the first direction until the scanning and exposing of the last exposure shot 222 of the second column is finished.

The above-described process may be repeated until all the exposure shots of the wafer 200 are scanned and exposed. The acceleration stage of the scanning process of the column scanning process may only exist in scanning process of the first exposure shot 211 of the first column; the de-acceleration stage may only exist in the scanning process of the last exposure shot of the last column; and the rest of the exposure shots may all be scanned and exposed with the predetermined constant speed. Therefore, the unnecessary acceleration time and de-acceleration time may be reduced; and the exposure efficiency may be improved. The scan-exposure process may be referred as a column scan-exposure process.

Figure 4:
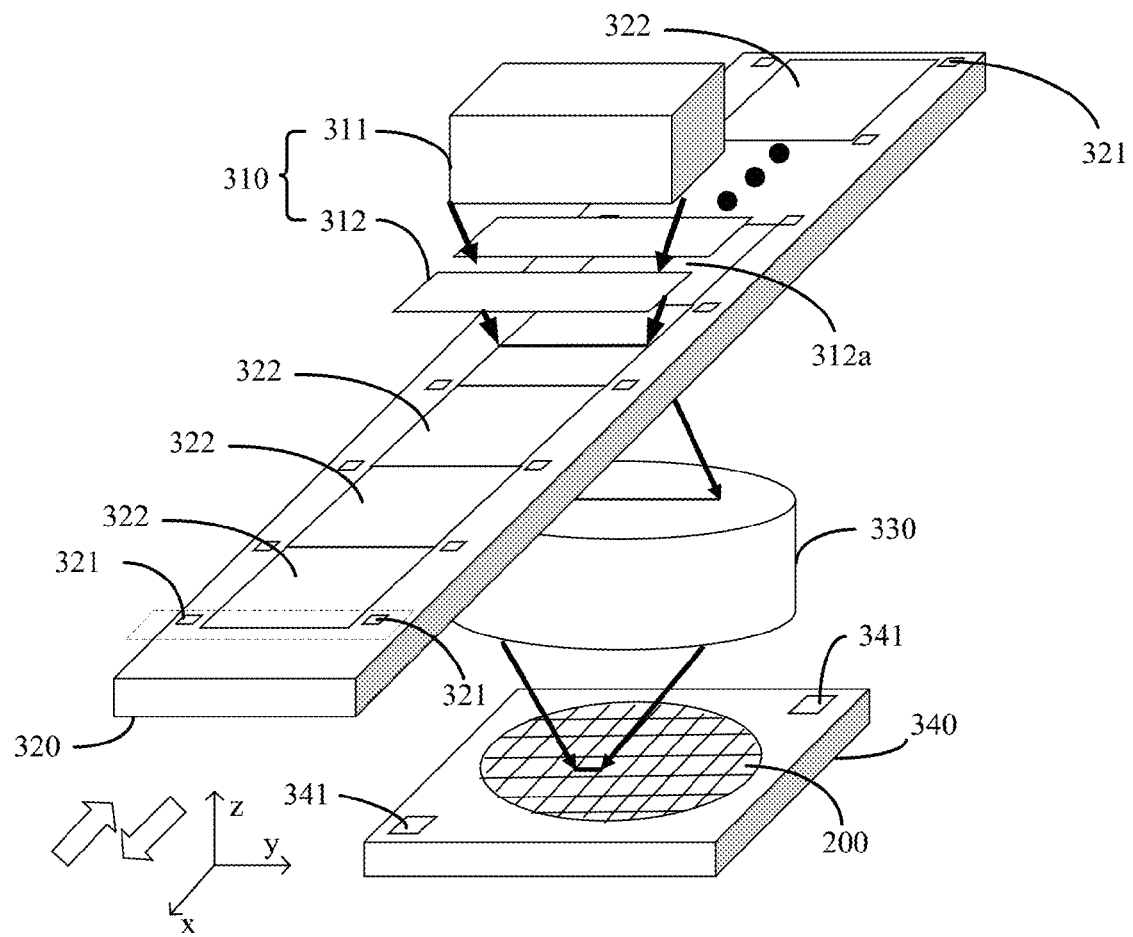
FIGS. 4-7 illustrate certain structures of an exemplary exposure apparatus consistent with the disclosed embodiments.

FIG. 4 illustrates an exemplary exposure apparatus for performing the column scan and exposure process consistent with the disclosed embodiments. As shown in FIG. 4, the exposure apparatus may include a light source system 310. The light source system 310 may be used to generate exposure light.

The exposure apparatus may also include a reticle stage (not shown). The reticle stage may be disposed under the light source system 310. The reticle stage may be used to load the long reticle 320; and may be able to carry the reticle 320 to reciprocally move along a scanning direction, i.e., the direction of the x-axis shown in FIG. 4.

The reticle 320 may have a plurality of mask pattern regions 322 and non-pattern region (not shown). The plurality of the mask pattern regions 322 may be aligned along the scanning direction. Further, the reticle 320 may be a long reticle. That is, the length (along the scanning direction) of the reticle 320 is greater than the width of the reticle 320. For example, if there are two mask pattern regions 322, the length of the reticle 320 may be approximately twice of the width of the reticle 320. Correspondingly, the reticle stage may be a long reticle stage, which may be able to load and hold the long reticle 320. The long reticle 320 having a plurality of mask pattern regions may be able to expose a column of exposure shots on the wafer 200 at a same time, or with a constant scanning speed.

Further, the exposure apparatus may include a wafer stage 340. The wafer stage 340 may be disposed under the reticle stage. The wafer stage 340 may be used to load a wafer, for example, the wafer 200; and may be able to carry the wafer 200 to reciprocally move along the scanning direction. The wafer 200 may have a plurality of exposure shots distributed by columns parallel to the scanning direction.

Further, the exposure apparatus may also include an optical projection system 330. The optical projection system 330 may be disposed between the wafer stage 340 and the reticle stage. The optical projection system 330 may be configured to focus the exposure light on the surface of the wafer 200.

Further, the exposure apparatus may also include a control unit (not shown). The control unit may be configured to control the motions and communications between the reticle stage and the wafer stage 340. The control unit may cause at least two mask pattern regions on the reticle 320 to be sequentially and continually projected onto at least two corresponding exposures shots on the wafer 200 on the wafer stage 340 along the scanning direction.

Referring to FIG. 4, the light source system 310 may include a light source 311 and a slit board 312, etc. The slit board 312 may have a slit 312a. The light emitting from the light source 311 may form a line scanning light source after passing through the slit 312a on the slit board 312. The line scanning light source may be used as an exposure light; and may irradiate on the mask pattern regions on the reticle 320. Further, the light passing through reticle 320 may be projected on the wafer 200 on the wafer stage 340 by the optical projection system 330; and the exposure shots on the wafer 200 may be exposed.

In one embodiment, the light source 311 may be a deep ultraviolet light, such as a KrF excimer laser having a wavelength of approximately 248 nm, or an ArF excimer laser having a wavelength of approximately 193 nm, etc. The light source 311 may also be a vacuum ultraviolet light, such as a $F_2$ laser with a wavelength of approximately 157 nm or an extreme ultraviolet light having a wavelength of approximately 13.5 nm. In certain other embodiments, the fluorescence light of the ultraviolet region (i-line or g-line) of a high pressure mercury lamp may be used as the light source 311.

The length of the slit 312a may be any appropriate value. In one embodiment, the length of the slit 312a along the y-axis direction may be equal to the width of the mask pattern region 322 on the reticle 320 (along the y-axis direction). In one embodiment, the width of the slit 312a may be in a range of approximately 1 mm~20 mm.

Referring to FIG. 4, the reticle stage (not shown) may connect with the drive unit (not shown) to cause the reticle stage to move along the x-axis direction, the y-axis direction, and the z-axis direction and rotate around the x-axis direction, the y-axis direction, and the z-axis direction. The drive unit may also cause the reticle 320 installed on the reticle stage to move along the x-axis direction, the y-axis direction, and the z-axis direction and rotate around the x-axis direction, the y-axis direction and the z-axis direction.

Referring to FIG. 4, the long reticle 320 may include a plurality of mask pattern regions 322 and non-image region (not shown) locating in the peripheral region of the plurality of mask pattern regions 322. The number of the mask pattern regions 322 may be equal to, or greater than two. The mask pattern regions 322 may be corresponding to the exposure shots on the wafer 200. In one embodiment, the number of the mask pattern regions 322 may be nine for a reticle 320 used for exposing a 12 inch wafer. The number of the mask pattern regions 322 may be 14 for a reticle 320 used for exposing an 18 in wafer.

The patterns in the mask pattern regions 322 may be same or different. When the patterns in the mask pattern regions 322 are identical, the patterns formed in the exposure shots on the wafer 200 may be the same after the exposure process. When the patterns in the mask pattern regions 322 are different, the patterns formed in the exposure shots on the wafer 200 may be different after the exposure process.

Further, referring to FIG. 4, a plurality of reticle alignment marks (not labeled) may be formed on the non-imaging region of the reticle 320. The reticle alignment marks may be used to align the reticle 320 with the wafer stage 340. The reticle alignment marks may include at least two groups of reticle alignment units (not labeled); and each alignment unit may include at least two reticle alignment mark patterns 321.

A plurality of reticle alignment mark detection units 341 may be disposed on the wafer stage 340. The reticle alignment mark detection units 341 may be able to obtain the position information of the reticle alignment mark patterns 341; and form a position relationship between the wafer stage 340 and the reticle 320. According to the position relationship, the control unit may control the movement of the wafer stage 340 and the reticle stage to finish an alignment of the reticle 320 and the wafer stage 340.

The reticle alignment mark patterns 321 may be formed on any appropriate positions of the non-image regions of the reticle 320. In one embodiment, the reticle alignment mark patterns 321 may be formed at both sides of the mask pattern regions 322 along the scanning direction. Two reticle alignment mark patterns 321 may be formed for each of the mark pattern regions 322.

Figure 5:
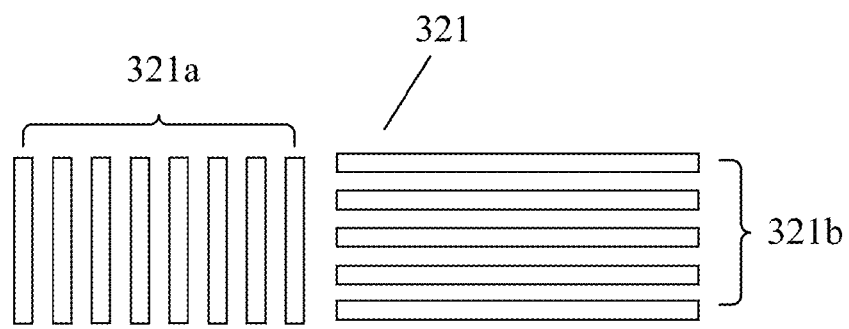

Further, referring to FIG. 5, in one embodiment, the reticle alignment mark patterns 321 may include a first optical grating 321a parallel to the scanning direction (the x-axis direction) and a second optical grating 321b vertical to the first optical grating 321a. The reticle alignment detection unit 341 disposed on the wafer stage 340 may obtain the position information of the reticle alignment mark patterns 321. By using the position information, the control unit may be able to calculate the translation coefficient of the reticle 320 along the x-axis direction and the y-axis direction, the amplification coefficient of the reticle 320 along the x-axis direction and the y-axis direction and the rotation coefficient and the orthogonal coefficient of the reticle 320 in the x-y plane.

Referring to FIG. 4, the optical projection system 330 may be disposed between the wafer stage 340 and the reticle stage. The optical projection system 330 may be used to focus and project the light passing through the reticle 320 on the surface of the wafer 200.

When the KrF excimer laser or the ArF excimer laser is used as the exposure light source, the optical projection system 330 may be a refractive system consisting of only optical devices, such as lenses, etc. The optical projection system 330 may also be a catadioptric system constructed by refractive optical devices and reflective optical devices, such as a concave mirror, or a beam splitter, etc.

When the $F_2$ excimer laser is used as the exposure light source, the optical projection system 330 may be a catadioptric system constructed by refractive optical devices and reflective optical devices, such as a concave mirror or a beam splitter, etc.

Referring to FIG. 4, in one embodiment, the wafer stage 340 may be disposed on a base (not shown). The base may provide a motion region for the wafer stage 340. The wafer stage 340 may move reciprocally along the scanning direction on the stage.

The wafer stage 340 may be driven by a magnetic suspension system to move in the xy-plane along the scanning direction and the z-axis direction. In one embodiment, the wafer stage 340 is in the xy-plane; and the wafer stage 340 may move along the x-axis direction and the y-axis direction.

In one embodiment, the magnetic suspension system may be maglev planar motor. The stator of the maglev planar motor may be disposed on the surface of the base; and the rotor of the maglev planar motor may be disposed on the bottom surface of the wafer stage 340. The maglev planar motor may be a moving coil permanent maglev planar motor, a moving iron permanent maglev planar motor, or an induction maglev planar motor, etc.

The wafer stage 340 may reciprocally move on the stage. Referring to FIG. 4, when the wafer stage 340 having the wafer 200 moves on the stage along the scanning direction (the x-axis direction), the exposure light passing through the reticle 320 having a plurality of mask pattern regions may be projected on the wafer 200 on the wafer stage 340. Therefore, the plurality of exposure shots on the wafer 200 aligning along the scanning direction may be exposed. That is, a column of exposure shots may be exposed at a same time; and the scan-exposure process may be referred as a column scan-exposure process.

In certain other embodiments, after exposing the plurality of the exposure shots of a column using the column scan-exposure method, the wafer stage 340 may move to the a next column of exposure shots along a direction (the y-axis direction) vertical to the scanning direction and expose the plurality of exposure shots of the column, thus the reciprocal scan and exposure process illustrated in FIG. 2 may be performed.

Using the reciprocal scan and exposure process, when a plurality of exposure shots of a certain column of the wafer 200 on the wafer stage 340 is exposed, the scanning direction of the wafer stage 340 may not be changed, and the moving direction of the reticle stage may also not be changed, thus the disclosed exposure apparatus may only need to accelerate before scanning the first exposure shot of the column; and may only need to de-accelerate after scanning the last exposure shot of the column. Therefore, not all the column scan-exposure process of the exposure apparatus have the acceleration process and the de-acceleration process, the average process time of an exposure shot may be significantly reduced; and the yield of the exposure apparatus per unit time may be improved.

Figure 3:
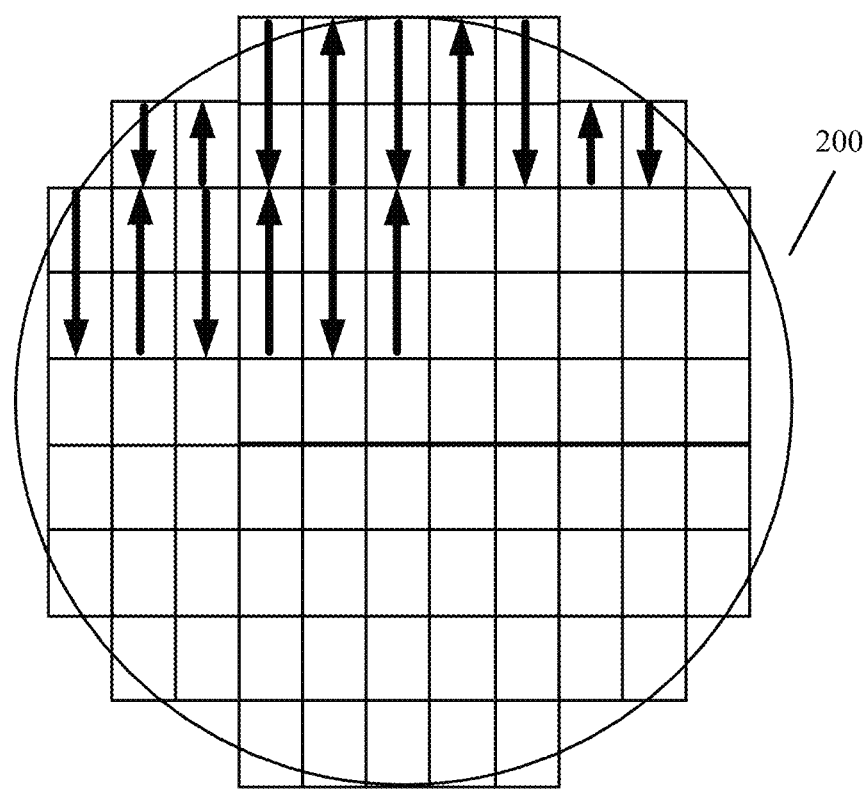
FIG. 3 illustrates an exemplary column scan-exposure process of multiple exposure shots performed by an exemplary exposure apparatus consistent with the disclosed embodiments.

In certain other embodiments, the disclosed exposure apparatus may be used to perform a multiple-exposure shot scan and expose process. For example, two or more exposure shots in one column may be scanned and exposed at a same time. FIG. 3 illustrates the column scan and exposure process of two exposure shots. Specifically, after scanning and exposing two exposure shots in a column on the wafer 200, the wafer stage 340 may move to the next column along a direction (y-axis direction) vertical to the scanning direction; and scan and expose two exposure shots in the column. Then, such a two-exposure shots scan and exposure may reciprocally continue until all the exposure shots on the wafer 200 are all scanned and exposed.

Referring to FIG. 3, although some single exposure shots on the edge of the wafer 200 may have to be scanned individually, it may lose some exposure speed because of the acceleration process and de-acceleration process. However, comparing the existing methods, the average exposure time for each of the exposure shot may be still significantly reduced; and the yield of the disclosed exposure apparatus per unit time may be improved.

In certain other embodiments, more than two exposure shots may be scanned and exposed at a same time. For example, three, four, or five exposure shots, etc., are exposed and scanned at a same time. Thus, the yield of the disclosed exposure apparatus may be improved.

Further, the top surface of the wafer stage 340 may include a wafer holding region (not labeled) and a surrounding peripheral region (not labeled). The wafer 200 may be installed in the wafer holding region. The reticle alignment mark detection units 341 may be disposed in the peripheral region of the wafer stage 340. The reticle alignment mark detection units 341 may be used to detect the reticle alignment marks 321 on the reticle 320 to form a position relationship between the reticle 320 and the wafer stage 340. Therefore, the position relationship between the reticle 320 and the wafer 200 on the wafer stage 340 may be formed; and the alignment process for the reticle 320 and the wafer 200 may be finished.

The reticle alignment mark detection units 341 may be disposed in the extension regions of the exposure shots of the wafer 200 on the wafer stage 340 along the scanning direction. After the reticle alignment mark detection units 341 finish detecting the reticle alignment marks on the reticle 320, the wafer stage 340 may unnecessarily change the moving direction; and may continue to move along the scanning direction to expose the rest exposure shots of the column along the scanning direction. Thus, the exposure time may be reduced.

The reticle alignment mark detection units 341 may include at three groups of reticle alignment mark detection sub units. The reticle alignment mark detection sub units may be disposed in the peripheral region of the wafer stage 340 along the scanning direction. Each group of the reticle alignment mark detection sub units may include two reticle alignment mark detection devices. The reticle alignment mark detection devices may be used to detect the two reticle alignment mark patterns 321 on the reticle 320.

Figure 6:
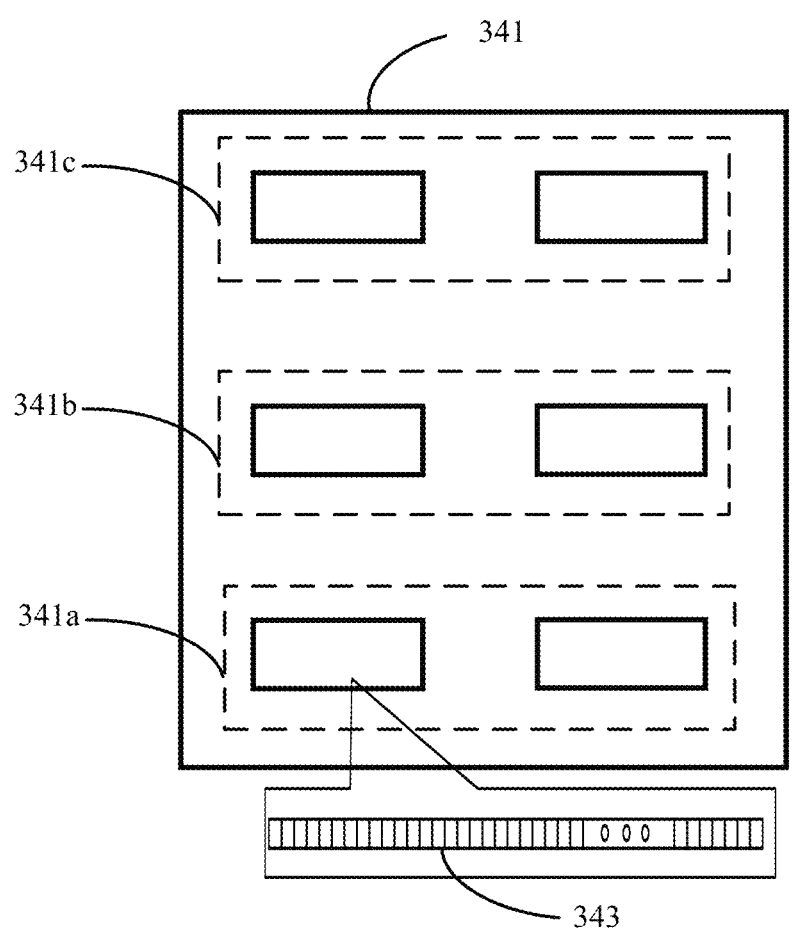

In one embodiment, as shown in FIG. 6, the reticle alignment mark detection unit 341 may include three groups of reticle alignment mark detection sub units: the first reticle alignment mark detection sub unit 341a; the second reticle alignment mark detection sub unit 341b; and the third reticle alignment mark detection sub unit 341c. The surface height of the three groups of reticle alignment mark detection sub units may be different. For example, the first reticle alignment mark detection sub unit 341a may have a predetermined height, the surface height of the second reticle alignment mark detection sub unit 341b may be lower than the surface height of the first reticle alignment mark detection sub unit 341a; and the surface height of the third reticle alignment mark detection sub unit 341c may be greater than the surface height of the first reticle alignment mark detection sub unit 341a.

When performing a detection of the reticle alignment marks, the first reticle alignment mark detection sub unit 341a; the second reticle alignment mark detection sub unit 341b; and the third reticle alignment mark detection sub unit 341c may be at the best focus plane and the de-focus plane of the optical system, respectively, thus when the reticle alignment mark detection units 341 performs an alignment of the reticle 320 in one scan, the best focus plane of the optical system of the exposure apparatus may be obtained.

For example, in one embodiment, when a detection of the reticle alignment marks 321 is performed, the first reticle alignment mark detection sub unit 341a may be at the best focus plane of the optical system; the second reticle alignment mark detection sub unit 341b may be at the negative de-focus plane of the optical system; and the third reticle alignment mark detection sub unit 341c may be at the positive de-focus plane of the optical system. According to the position information of the wafer stage 340 (height in the z-axis), the height of the first reticle alignment mark detection sub unit 341a and the designed height between the center of the optical system and the base, the best focus plane of the optical system may be obtained by calculations.

In one embodiment, the height difference between the top surface height of the second reticle alignment mark detection sub unit 341b and the top surface height of the first reticle alignment mark detection subunit 341a may be in a range of approximately 50 nm~1000 nm. The height difference between the top surface height of the third reticle alignment mark detection sub unit 341c and the top surface height of the first reticle alignment mark detection sub unit 341a may be in a range of approximately 50 nm~1000 nm. Such height differences may cause the reticle alignment mark detection units 341 to have a significantly high sensitivity for detecting the best focus plane; and have a significantly high accuracy of the best focus distance.

The top surface height of the first reticle alignment mark detection sub unit 341a may refer to a height of the top surface of the first reticle alignment mark detection sub unit 341a relative to the top surface of the wafer stage 340. Further, the positions of the first reticle alignment mark detection sub unit 341a; the second reticle alignment mark detection sub unit 341b and the third reticle alignment mark detection sub unit 341c may have other appropriate combinations.

As shown in FIG. 6, each group of the reticle alignment mark detection sub units may include two reticle alignment mark detection devices. The reticle alignment mark detection devices may be any appropriate devices. In one embodiment, the reticle alignment mark detection device may be a one-dimensional array of optoelectronic sensors 343 (photo intensity detector). The one-dimensional array optoelectronic sensors 343 may include a plurality of optoelectronic sensor sub units aligned with a direction perpendicular to the scanning direction (the y-axis direction). When a light irradiates on the one-dimensional optoelectronic sensors 343, the light passing through the reticle alignment mark patterns 322 may be received by the one-dimensional array of optoelectronic sensors 343. The one-dimensional array of optoelectronic sensors 343 may convert the received light signal into electrical signals varying with time.

According to the delay time of the output electrical signals, the pulse width of the output electrical signals and the interval of the pulse electrical signals, the position of the reticle alignment mark patterns 321 on the reticle 320 may be determined. The length of the one-dimensional array of optoelectronic sensors 343 along the y-axis direction may be greater than the width of the reticle alignment mark patterns 321, thus even there are reticle installation errors and/or the system drift, the one-dimensional array of optoelectronic sensors 343 may be still able to detect the entire reticle alignment mark patterns 321. In one embodiment, the installation errors and the system shift of the one-dimensional array of optoelectronic sensors 343 along the y-axis direction may be in a range of approximately 1 μm~100 μm.

In certain other embodiments, the reticle alignment mark detection devices may be two-dimensional imaging sensor, such as CCD imaging sensor, etc.

Figure 7:
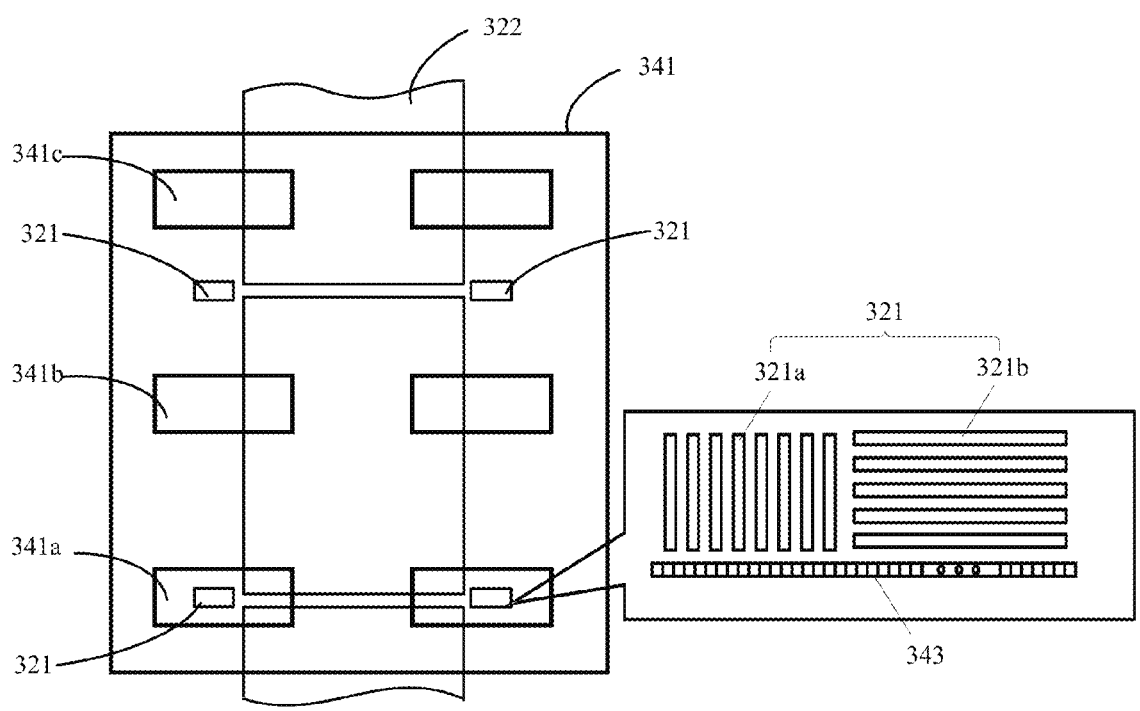

As shown in FIG. 7, when detecting the reticle alignment mark patterns 321, the wafer stage 340 may move along the scanning direction to cause the first reticle alignment mark detection sub unit 341a to be under the optical projection system 330 (referring to FIG. 4). The light of the light source 311 passing through the slit board 312 may irradiate on a group of reticle alignment marks on the reticle 320. At the same time, the reticle 320 may move toward to the wafer stage 340 along the scanning direction; thus the light passing through the reticle alignment mark patterns 321 may be received by the first reticle alignment mark detection sub unit 341a. Then, the wafer stage 340 may continue to move along the scanning direction (the x-axis direction) to cause the second reticle alignment mark detection sub unit 341b to be under the optical projection system 330; thus the light passing through the reticle alignment mark patterns 321 may be received by the second reticle alignment mark detection sub unit 341b. Then, the wafer stage 340 may continue to move along the scanning direction (the x-axis direction) to cause the third reticle alignment mark detection sub unit 341c to be under the optical projection system 330; thus the light passing through the reticle alignment mark patterns 321 may be received by the third reticle alignment mark detection sub unit 341c.

Thus, during the entire process, the wafer stage 340 does not need to move in the z-axis direction to save time in reticle alignment. Further, the first reticle alignment mark detection sub unit 341a, the second reticle alignment mark detection sub unit 341b and the third reticle alignment mark detection sub unit 341c may obtain a plurality of electrical signals, respectively.

Therefore, the control unit of the exposure apparatus may obtain the position information of the reticle 320 and the wafer stage 340 according to the electrical signals, the heights of the reticle alignment mark detection sub units, the position information of the wafer stage 340 (the height in the z-axis direction), the center of the optical system and the designed height of the wafer stage 340. Then, the control unit may control the reticle stage 320 and the wafer stage 340 to cooperatively perform an alignment; and the wafer 200 on the wafer stage 340 may be disposed at the best focus distance of the optical projection system 330.

For an exposure process, the wafer stage of an exposure apparatus may also need to be leveled. The leveling process of the wafer stage 320 of the disclosed exposure apparatus may be performed by any appropriate leveling system including an existing leveling system. The disclosed exposure apparatus may be compatible with the existing leveling system, thus it may be easy to perform the leveling process.

Figure 8:
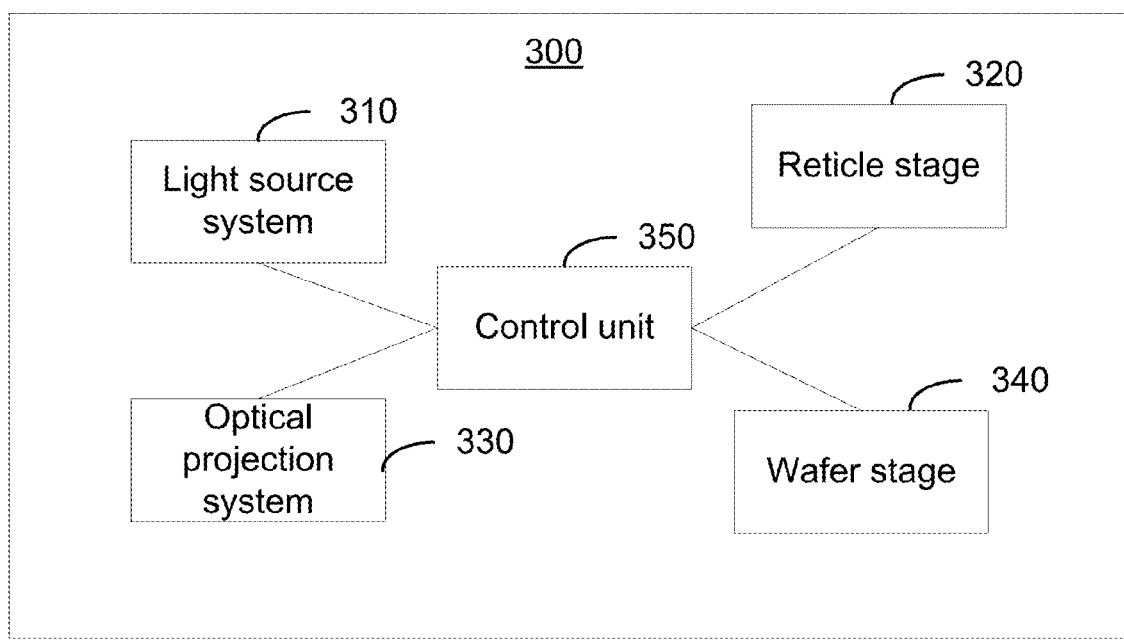
FIG. 8 illustrates the functions of the components of an exemplary exposure apparatus consistent with the disclosed embodiments.

FIG. 8 illustrates the functions of the components of an exemplary exposure apparatus 300 consistent with disclosed embodiments. As shown in FIG. 8, the control unit 350 connects and communicates with the light source system 310, the reticle stage 320, the optical projection system 330 and the wafer stage 340; and manages the wafer alignment process, and the exposure process. The control unit 350 may be able to control the reticle stage 320 and the wafer stage 340 to corporately move; and cause at least two mask pattern regions 322 on the reticle 320 to be continually and sequentially projected on the at least two corresponding exposure shots of the wafer 200 on the wafer stage 340 along the scanning direction. The control unit 350 may also be able to send a plurality of control commands; to receive feedback information from all units; to save exposure programs; to save related position information; and to perform logic computation, etc.

Correspondingly, the present disclosure also includes a long reticle 320 matching with the disclosed exposure apparatus. As shown in FIG. 4, the long reticle 320 may include a substrate and at least two mask pattern regions 322. The at least two mask pattern regions 322 may be continually and sequentially transferred on two corresponding exposure shots on the wafer 200. The at least two mask pattern regions 322 may be distributed along the scanning direction.

In one embodiment, the patterns of the at least two mask pattern regions 322 are identical. Reticle alignment marks may be formed in the peripheral region of each of the mask pattern regions 322. The reticle alignment mask may include at least two reticle alignment mark units; and each of the reticle alignment mark unit may include at least two reticle alignment mark patterns 321. The at least two alignment mark patterns 321 may be disposed at both sides of the mask pattern regions 322. Referring to FIG. 5, the reticle alignment mark patterns 321 may include the first optical grating 321a parallel to the scanning direction and the second optical grating 321b vertical to the first optical grating 321a.

Figure 9:
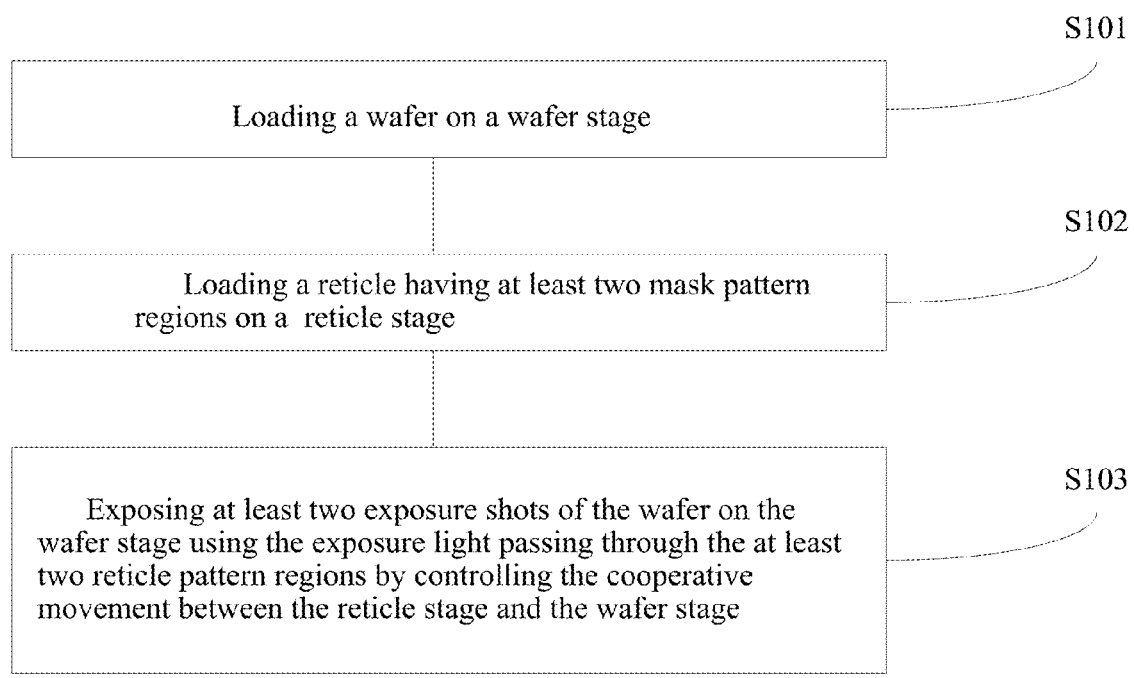
FIG. 9 illustrates an exemplary exposure process using the disclosed exposure apparatus consistent with the disclosed embodiments.

Therefore, the present disclosure also includes a column scan-exposure process performed by the disclosed exposure apparatus. FIG. 9 illustrates an exemplary column scan-exposure process consistent of the disclosed embodiments.

As shown in FIG. 9, the exposure process includes loading a wafer on a wafer stage (S101). The wafer may have a plurality of exposure shots.

The exposure process also includes loading a long reticle on a long reticle stage (S102). The long reticle stage may be disposed above the wafer stage. The long reticle may have at least two mask pattern regions; and the at least two mask patterns may be distributed along a scanning direction.

Further, the exposure process may include exposing at least two exposure shots of the wafer on the wafer stage using the exposure light passing through the at least two reticle pattern regions by controlling the cooperative movement between the reticle stage and the wafer stage (S103). Before exposing the at least two exposure shots, the wafer on the wafer stage may be aligned with the reticle.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An exposure apparatus for performing a column scan-exposure process, comprising:
   a base for supporting the exposure apparatus;
   a reticle stage configured for holding a reticle and carrying the reticle to move reciprocally along a scanning direction;
   a wafer stage configured for holding a wafer and carrying the wafer to move reciprocally along a direction opposite to the reticle scanning direction; and
   a control unit configured to control the reticle stage and the wafer stage to cooperatively move to cause two or more mask pattern regions of the reticle on the reticle stage to be continuously and sequentially projected on a first exposure shot first, and then, on a second exposure shot in a same column on the wafer on the wafer stage along the scanning direction to perform a column scan-exposure process, wherein the control unit is configured to control the wafer stage to move in a direction perpendicular to the scanning direction of the reticle stage.

2. The exposure apparatus according to claim 1, wherein:
   a plurality of reticle alignment mark detection units are formed in a peripheral region of the wafer stage; and
   the reticle alignments mark detection units on the wafer stage are used to detect reticle alignment marks formed on the reticle to align the reticle with the wafer stage.

3. The exposure apparatus according to claim 1, further including:
   a light source system configured to generate a line exposure light; and
   an optical projection system configured to project the light passing through the reticle onto the exposure shots on the wafer.

4. The exposure apparatus according to claim 2, wherein:
   the reticle alignment mark detection unit on the wafer stage includes at least three groups of reticle alignment mark detection sub units;
   the reticle alignment mark detection sub units on the wafer stage are distributed along the scanning direction of the reticle stage; and
   each of the reticle alignment mark detection sub units on the wafer stage includes at least two reticle alignment sensors configured to detect at least two reticle alignment marks on the reticle, respectively.

5. The exposure apparatus according to claim 1, wherein:
   a plurality of reticle alignment mark detection units are formed in a peripheral region of the wafer stage;
   the reticle alignment mark detection unit on the wafer stage includes three groups of reticle alignment mark detection sub units; and
   top surface heights of the three groups of reticle alignment mark detection sub units are different, such that three different focus positions are used by the reticle alignment mark detection sub units on the wafer stage to sense reticle alignment mark patterns at three different focus positions when the wafer stage is scanned at a fixed height.

6. The exposure apparatus according to claim 4, wherein:
   each of the reticle alignment sensors on the wafer stage is a linear array of photo intensity detectors.

7. The exposure apparatus according to claim 6, wherein:
   a length of the linear array of photo intensity detectors on the wafer stage is greater than a width of the reticle alignment marks on the reticle plus position variations due to reticle loading and system shift.

8. A column scan-exposure method, comprising:
   loading a wafer having a plurality of exposure shots on a wafer stage;
   loading a reticle having two or more mask pattern regions distributed along a scanning direction on a reticle stage;
   continuously and sequentially exposing two or more exposure shots by controlling the wafer stage and the reticle stage to cooperatively move to cause an exposure light passing through the two or more mask pattern regions on the reticle to be projected onto a first exposure shot first, and then, a second exposure shot of the two or more exposure shots in a same column on the wafer, wherein the wafer stage moves in a direction perpendicular to the scanning direction of the reticle stage.

9. The exposure method according to claim 8, after exposing the first and second exposure shots, further including:
   exposing all other exposure shots one by one in the same column with a same constant scanning speed;
   de-accelerating the wafer stage and the reticle stage; and
   moving the wafer stage and the reticle stage to scan and expose at least two exposure shots of a next column.

10. The exposure method according to claim 8, before exposing the two or more exposure shots, further including:
    aligning the reticle stage with the wafer stage to perform a column scan-exposure process.

11. The exposure method according to claim 10, where in aligning the reticle stage with wafer stage further includes:
    detecting reticle alignment marks on the reticle using reticle alignment mark detection units on the wafer stage to obtain a position relationship between the wafer stage and the reticle; and
    adjusting positions of the wafer stage and the reticle to align the wafer stage with the reticle according to the position relationship.

12. The exposure method according to claim 11, wherein:
    the reticle alignment marks are formed in a peripheral region around the mask pattern regions on the reticle;
    the reticle alignment marks include at least two groups of reticle alignment mark units;
    each of the reticle alignment mark units includes at least two reticle alignment mark patterns; and
    the two reticle alignment mark patterns are formed at both sides of each of the mask pattern regions on the reticle.

13. The exposure method according to claim 11, wherein:
    the reticle alignment mark detection unit on the wafer stage includes at least three groups of reticle alignment mark detection sub units;
    the reticle alignment mark detection sub units on the wafer stage are distributed along the scanning direction of the reticle stage; and
    each of the reticle alignment mark detection sub units includes at least two reticle alignment sensors configured to detect at least two reticle alignment marks on the reticle, respectively.

14. The exposure method according to claim 8, wherein:
    patterns of the at least two mask pattern regions are identical.

15. The exposure method according to claim 8, wherein:
    a plurality of reticle alignment mark detection units are formed in a peripheral region of the wafer stage;
    the reticle alignment mark detection unit on the wafer stage includes three groups of reticle alignment mark detection sub units; and
    top surface heights of the three groups of reticle alignment mark detection sub units are different, such that three different focus positions are used by the reticle alignment mark detection sub units on the wafer stage to sense reticle alignment mark patterns at three different focus positions when the wafer stage is scanned at a fixed height.

16. The exposure method according to claim 8, wherein: patterns in the at least two mask pattern regions are different.

* * * * *